(12) United States Patent
Koyama

(10) Patent No.: US 8,012,545 B2
(45) Date of Patent: *Sep. 6, 2011

(54) FILM FORMING METHOD, FILM FORMING APPARATUS, METHOD OF MANUFACTURING DEVICE, AND APPARATUS FOR MANUFACTURING DEVICE

(75) Inventor: Minoru Koyama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 552 days.

This patent is subject to a terminal disclaimer.

(21) Appl. No.: 11/588,240

(22) Filed: Oct. 27, 2006

(65) Prior Publication Data

US 2007/0042111 A1     Feb. 22, 2007

Related U.S. Application Data

(62) Division of application No. 10/647,225, filed on Aug. 26, 2003, now Pat. No. 7,422,768.

(30) Foreign Application Priority Data

Aug. 27, 2002   (JP) .................................. 2002-246925

(51) Int. Cl.
    *B05D 5/00*     (2006.01)
    *B05D 5/12*     (2006.01)
(52) U.S. Cl. ........ 427/421.1; 427/66; 427/162; 427/168

(58) Field of Classification Search ................... 427/162, 427/168, 66, 421.1; 118/682, 305, 323, 696, 118/302
See application file for complete search history.

(56) References Cited

U.S. PATENT DOCUMENTS

| 5,772,764 | A  | * | 6/1998 | Akimoto ...................... 118/319 |
| 6,084,650 | A  | * | 7/2000 | Sekiguchi .................... 349/106 |
| 6,508,528 | B2 |   | 1/2003 | Fujii et al. |
| 6,660,332 | B2 |   | 12/2003 | Kawase et al. |
| 2001/0020962 | A1 | * | 9/2001 | Kanaya et al. .................. 347/24 |
| 2001/0050696 | A1 | * | 12/2001 | Suzuki et al. .................. 347/27 |
| 2002/0105080 | A1 | * | 8/2002 | Speakman ..................... 257/749 |
| 2002/0176927 | A1 | * | 11/2002 | Kodas et al. ....................... 427/8 |

FOREIGN PATENT DOCUMENTS

| CN | 1267598 A | 9/2000 |
| CN | 1358626 A | 7/2002 |
| EP | 1 168 407 A1 | 1/2002 |
| JP | A 2001-180007 | 7/2001 |
| JP | A 2002-67346 | 3/2002 |

* cited by examiner

*Primary Examiner* — James Lin
(74) *Attorney, Agent, or Firm* — Oliff & Berridge, PLC

(57) ABSTRACT

The invention provides a film forming method that improves throughput in a preliminary discharge. The film forming method according to the present invention can include a preliminary discharge step of preliminarily discharging liquid droplets from a head and a liquid droplet discharge step of relatively moving the head and the work to discharge the liquid droplets onto the surface of the work from the head. The preliminary discharge of the liquid droplets is carried out while the head and the work are moved relative to each other.

5 Claims, 7 Drawing Sheets

FILM FORMING METHOD, FILM FORMING APPARATUS, METHOD OF MANUFACTURING DEVICE, AND APPARATUS FOR MANUFACTURING DEVICE

BACKGROUND OF THE INVENTION

1. Field of Invention

The present invention relates to a film forming method, a film forming apparatus, a method of manufacturing a device, and an apparatus for manufacturing a device, in which a film body made from functional material is formed on the surface of a work using liquid droplet discharge heads.

2. Description of Related Art

With the development of electronic apparatuses, such as computers or portable information appliances, liquid crystal display devices, specifically, color liquid crystal display devices (LCD) have been more widely used. A liquid crystal display device of this type uses color filters for coloring display images. In a color filter having a substrate as a work, a film may be formed by depositing liquid ink droplets of R (red), G (green), and B (blue) as in a predetermined pattern on the substrate. The method for depositing the inks onto the substrate may include a liquid droplet discharge method, such as an inkjet method.

When the liquid droplet discharge method is employed, a predetermined amount of liquid is discharged from liquid droplet discharge heads as discharge device and deposited onto filters. In this case, for example, a substrate is mounted on a Y-axis table (a table freely movable in the Y-axis direction) and the liquid droplet discharge heads is mounted on an X-axis table (a table freely movable in the X-axis direction). After the liquid droplet discharge heads are positioned at predetermined positions by driving the X-axis table, the liquid droplets are discharged while the substrate is moved (scanned) relative to the liquid droplet discharge heads by driving the Y-axis table, so that the liquid droplets from a plurality of liquid droplet discharge heads can be deposited in predetermined positions of the substrate.

SUMMARY OF THE INVENTION

In the aforementioned liquid droplet discharge method, a preliminary discharge (referred to as flushing) is carried out before discharging the liquid droplets onto the substrate, in order to prevent an increase in the viscosity of the liquid within the heads or a segregation of solid contents. These conditions may interfere with carry out the stable discharge of liquid droplets, and so must be avoided. Conventionally, this preliminary discharge is carried out by preparing an exclusive preliminary discharge area which contains sponge or similar item at one or both of ends of the Y-axis table and positioning (stopping) the Y-axis table such that the preliminary discharge area is positioned below the heads. Thereafter, by carrying out general discharge of the liquid droplets, a liquid in which the variation of components is small can be applied onto the substrate.

However, in the conventional art as described above, there are the following problems:

During the flushing procedure, the following processes must be performed individually: the process of positioning the heads in the preliminary discharge area, the process of preliminarily discharging the liquid droplets from the heads, and the process of accelerating the Y-axis table up to a predetermined speed in order to carry out the general discharge. In other words, since the Y-axis table is subjected to a control pattern of acceleration-deceleration-stop-acceleration, there is a problem that the throughput is decreased in the scanning when using the conventional flushing procedure. Specifically, when discharging a liquid having a tendency to experience clogging or an increase in viscosity, the flushing has to be carried out frequently, and thus if the quality of film is to be maximized, a decrease of throughput is unavoidable.

The present invention is contrived in consideration of at least the above problems, and thus it is an object of the present invention to provide a film forming method, a film forming apparatus, a method of manufacturing a device, and an apparatus for manufacturing a device, in which the preliminary discharge can be carried out without an attendant decrease of throughput. In order to accomplish the above object, the present invention employs the following configurations.

A film forming method according to the present invention can be a film forming method including a preliminary discharge step of preliminarily discharging liquid droplets from heads and a liquid droplet discharge step of relatively moving the heads and a work to discharge the liquid droplets onto the surface of the work from the heads, wherein the preliminary discharge of the liquid droplets is carried out while the heads and the work are moved relative to each other. Therefore, in the film forming method according to the present invention, since a discrete step of stopping the relative movement of the heads and the work need not be preformed during the liquid droplet discharge step, it is possible to prevent a decrease of throughput.

It is preferable that the preliminary discharge of the liquid droplets be carried out during acceleration of the head and/or work up to a predetermined relative speed in the liquid droplet discharge step. By doing so, in the present invention, since the preliminary discharge can be carried out in the course of the liquid droplet discharge step, the step of carrying out the preliminary discharge need not be performed separately, thereby improving throughput.

Furthermore, a procedure may be employed in which the preliminary discharge of the liquid droplets is carried out in a liquid droplet reception area, a part of which is formed by the work. In this case, since the preliminary liquid droplets can be collected in and drained from the liquid droplet reception area, a part of which is formed by the work, the discharge interval between the preliminary discharge and the liquid droplet discharge onto the work can be minimized, so that it is possible to prevent an increase in the viscosity of liquid or a segregation of solid contents within the liquid after the preliminary discharge.

Furthermore, in the present invention, a procedure may be employed which includes a vibrating step of, after the liquid droplet discharge step, vibrating the liquid within the heads to an extent that the liquid is not discharged from the heads. The preliminary discharge may not be necessary, for example, when carrying out the discharge of the liquid droplets at the same time as reversing the direction of the relative movement. However, even in this case, by vibrating the liquid within the heads, an increase in the viscosity of the liquid or a segregation of the solid content within the liquid is prevented and it is possible to carry out a stable discharge of the liquid droplets. Furthermore, since the liquid is not discharged from the heads while vibrating the liquid, it is possible to prevent the liquid from being wasted.

Then, a method of manufacturing a device according to the present invention can be employed in which a film body is formed by discharging liquid droplets onto the surface of a work from heads. The film body can be formed on the work using the aforementioned film forming method. Therefore, in the present invention, when the film body is formed on the work, a decrease of throughput can be prevented, so that it is possible to efficiently manufacture a device.

The method of manufacturing a device according to the present invention may be applied to a case in which the film body is a transmissive coating film formed on a lens as the work. By doing so, it is possible to easily and efficiently form the coating film on the surface of the lens. Furthermore, the lens is a spectacle lens.

Furthermore, the method of manufacturing a device according to the present invention may be applied to a case that an overcoat film for coating filter elements is formed, using as the work a substrate on which the filter elements are arranged. By doing so, it is possible to easily and efficiently form the overcoat film on the surface of the filter elements.

Furthermore, the method of manufacturing a device according to the present invention may be applied to a case in which a counter electrode film is formed at a predetermined place above EL light-emitting layers, using as the work a substrate on which pixels, including the EL light-emitting layers, are arranged. By doing so, it is possible to easily and efficiently form the counter electrode film on the surface of the EL light-emitting layers.

On the other hand, a film forming apparatus according to the present invention forms a film by relatively moving heads and a work to discharge liquid droplets onto the surface of the work from the heads, the apparatus comprising a control unit for preliminarily discharging the liquid droplets from the heads while the heads and the work are moved relative to each other. Therefore, in the film forming apparatus according to the present invention, since a discrete step of stopping the relative movement of the heads and the work need not be performed during the liquid droplet discharge step, it is possible to avoid a decrease of throughput.

It is preferable that the preliminary discharge of the liquid droplets be carried out during acceleration of the head and/or work up to a predetermined relative speed. By doing so, in the present invention, since the preliminary discharge can be carried out in the course of the relative movement for carrying out the liquid droplet discharge, a step of carrying out the preliminary discharge need not be performed separately, so that it is possible to improve throughput.

Furthermore, it is preferable to employ a configuration in which a liquid droplet reception area is partially formed by the work and receives the preliminary liquid droplets. In this case, since the preliminary liquid droplets can be collected in and discharged from the liquid droplet reception area, a part of which is formed by the work, the discharge interval between the preliminary discharge and the liquid droplet discharge onto the work can be minimized, so that it is possible to prevent an increase in the viscosity of the liquid or a segregation of solid contents within the liquid after the preliminary discharge.

Furthermore, in the present invention, a configuration may be employed in which, following the liquid droplet discharge onto the surface of the work, the liquid is vibrated within the heads to an extent that the liquid is not discharged from the heads. The preliminary discharge may not be necessary, for example, when carrying out the discharge of the liquid droplets at the same time as reversing the direction of the relative movement. However, even in this case, by vibrating the liquid within the heads, an increase in the viscosity of the liquid or a segregation of solid contents within the liquid is prevented, and thus it is possible to carry out a stable discharge of the liquid droplets. Furthermore, since the liquid is not discharged from the heads while vibrating the liquid, it is possible to prevent the liquid from being wasted.

Then, an apparatus for manufacturing a device according to the present invention is employed, in which a film body is formed by discharging liquid droplets onto the surface of a work from heads, wherein the film body is formed on the work using the aforementioned film forming apparatus. Therefore, in the present invention, when the film body is formed on the work, a decrease of throughput can be prevented, so that it is possible to efficiently manufacture a device.

The apparatus for manufacturing a device according to the present invention may be applied to a case in which the film body is a transmissive coating formed on a lens as the work. By doing so, it is possible to easily and efficiently form the coating film on the surface of the lens. Furthermore, the lens is a spectacle lens.

Furthermore, the apparatus for manufacturing a device according to the present invention may be applied to a case in which an overcoat film for coating filter elements is formed, using as the work a substrate on which the filter elements are arranged. By doing so, it is possible to easily and efficiently form the overcoat film on the surface of the filter elements.

Furthermore, the apparatus for manufacturing a device according to the present invention may be applied to a case in which a counter electrode film is formed at a predetermined place above EL light-emitting layers, using as the work a substrate on which pixels, including the EL light-emitting layers, are arranged. By doing so, it is possible to easily and efficiently form the counter electrode film on the surface of the EL light-emitting layers.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Now, embodiments of the film forming method, the film forming apparatus, the method of manufacturing a device, and the apparatus for manufacturing a device according to the present invention will be described with reference to FIGS. 1 through 8.

Here, the film forming apparatus of the present invention is applied to, for example, a liquid droplet discharge apparatus for manufacturing a spectacle lens. In other words, the present invention will be described by way of an example in which a functional liquid is discharged onto the spectacle lens (work) which is a target for the discharge of functional liquid from a liquid droplet discharge head filled with the functional liquid. Specifically, the spectacle lens could be coated with a film body, such as a UV cut agent or an anti-fogger, and thus the work is coated (hard-coated) with a film made from a functional material.

Figure 1:
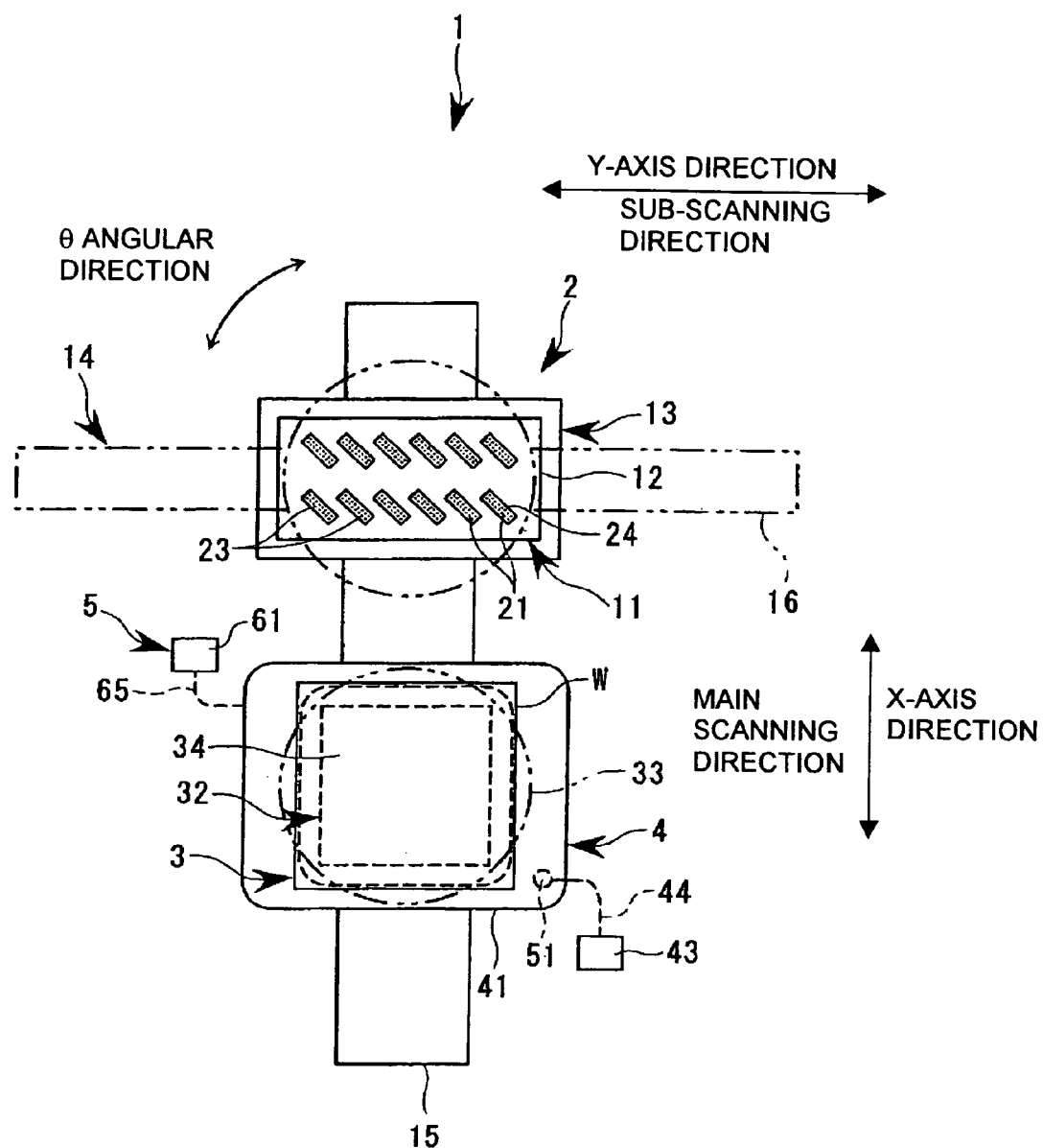
FIG. 1 is a schematic view illustrating a basic configuration of a liquid droplet discharge apparatus according to an embodiment of the present invention.

FIG. 1 is a schematic view illustrating a basic construction of a liquid droplet discharge apparatus constituting the apparatus for manufacturing a device. As shown in FIG. 1, the liquid droplet discharge apparatus (film forming apparatus) 1 can include a functional liquid discharge device 2 for discharging a functional liquid onto a work W, which is a target for the discharge of the functional liquid, a mounting device 3 for mounting the work W to the apparatus, a waste functional liquid storage device 4 for storing the functional liquid splashed from the work W, and a cleaning device 5 to be described later for cleaning the waste functional liquid storage means 4 which may become contaminated by the waste functional liquid. Each of these devices are coupled to a common controller (or control unit) (see FIG. 3), and this controller 6 mutually associates and generally controls these respective devices.

Further, although not shown, the liquid droplet discharge apparatus 1 is provided with auxiliary units, such as a work recognition camera for recognizing (or picking up) an image of the work W, a head recognition camera for recognizing an image of the head unit 11 (or discharge nozzles 23), and a variety of indicators, all of which are connected to the controller 6.

This liquid droplet discharge apparatus 1 forms a film body made from the functional material on the surface of the work W to coat the work W with the functional material, by discharging droplets of functional liquid containing the functional material onto the surface of the work W while the work W mounted to the mounting means 3 is scanned by the head unit 11 of the functional liquid discharge means 2. Further, in the liquid droplet discharge apparatus 1, the head unit 11 discharges the functional liquid uniformly onto any portions of the work W. That is, it discharges the functional liquid onto edge portions of the work W, similarly to discharge of the functional liquid onto the central portion of the work W, so as to uniformly coat the whole surface of the work W with the functional material. Also, since the functional liquid is splashed from the work W to some extent when the functional liquid is discharged to the edge portions of the work W similar to discharge of the functional liquid to the central portion of the work W, a waste functional liquid storage means 4 is provided for receiving and storing the splashed functional liquid. Further, since the functional liquid is discharged while it is splashed from the work W, it is not necessary to accurately establish the mounting position of the work W.

The functional liquid discharge device 2, as shown in FIG. 1, can include a head unit 11, on which functional liquid discharge heads (or simply referred to as heads) are mounted thereon, a main carriage 13 for suspending and supporting the head unit 11, and an X and Y movement mechanism 14 for moving the work W in the main scanning direction (X-axis direction) through the mounting device 3 and freely moving the head unit 11 in the sub-scanning direction (Y-axis direction).

Figure 2A:
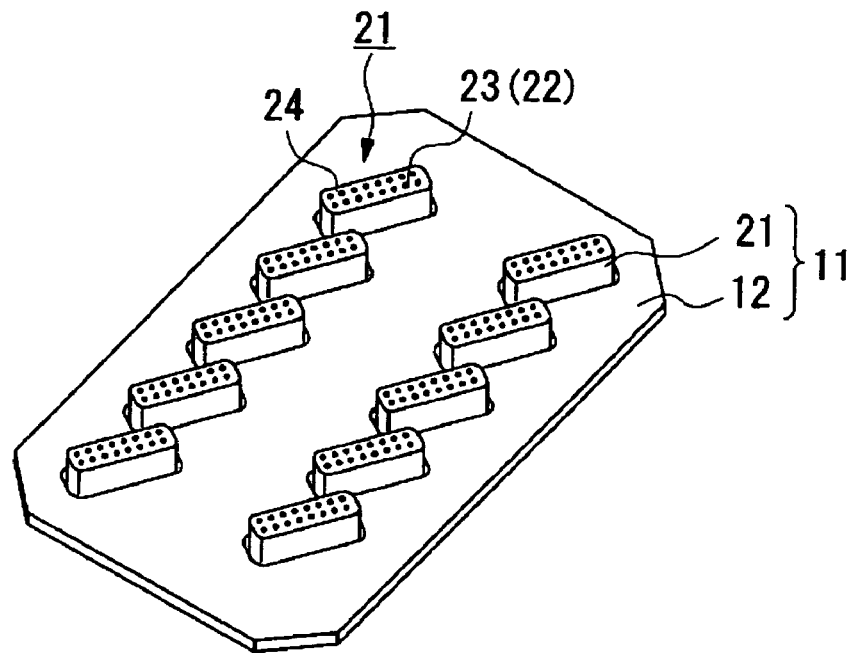
FIG. 2(a) is a perspective view illustrating an outward appearance of a sub-carriage after fixating a head and FIG. 2(b) is a perspective view illustrating an outward appearance of a sub-carriage before fixating a head.

As shown in FIG. 2(a), the head unit 11 can include a plurality of functional liquid discharge heads 21 and a sub-carriage 12 on which the functional liquid discharge heads 21 are mounted. The functional liquid discharge head 21 includes a sub-carriage fitting portion (not shown) having a head substrate or a functional liquid introducing portion, and a head body 22 having discharge nozzles 23 for discharging the functional liquid. Then, two nozzle rows, each of which has a plurality of discharge nozzles 23, are formed on the nozzle surface 24 of the head body 22, and the functional liquid discharge head 21 is fitted (fixed) to the sub-carriage 12 such that the nozzle surface 24 faces downward (in FIG. 2, the up-and-down direction is reversed for the purpose of convenience).

Figure 2B:
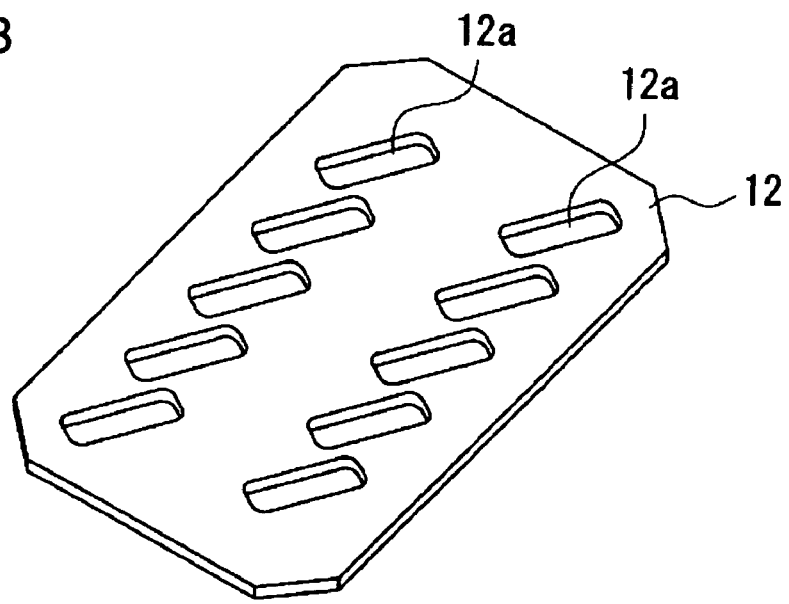

The sub-carriage 12 can be formed with two rows of fitting openings 12a for fitting the functional liquid discharge heads 21 (see FIG. 2(b)), and each row consists of six fitting openings. That is, six functional liquid discharge heads 21 are fitted to one row of fitting openings, and thus a total of twelve functional liquid discharge heads 21 are fitted to the sub-carriage 12. Further, the fitting openings establish the fitting positions of the respective functional liquid discharge heads 21, and are oriented obliquely by a predetermined angle with respect to the main scanning direction to arrange the respective functional liquid discharge heads 21 so that sufficient coating density is achieved on the work W.

The main carriage 13 can have a carriage body (not shown) for suspending and supporting the head unit 11, and a head bracket (not shown) supporting the carriage body, which is allowed to slide in the sub-scanning direction (Y-axis direction) by a Y-axis table 16 to be described later. The carriage body itself is constructed to allow rotation in a θ angular direction (a direction around the Z axis), and by rotating the carriage body in the θ direction, the position of the nozzle surface 24 of the head body 22 in the θ angular direction can be adjusted properly. Further, the adjustment of the nozzle surface in the θ angular direction is carried out on the basis of the recognized image from the head recognition camera (not shown).

The X and Y movement mechanism 14 can include an X-axis table 15 for supporting the mounting device for mounting the work W, and a Y-axis table 16 orthogonal to the X-axis table 15, for supporting the head unit 11 with the head bracket. Furthermore, the X and Y movement mechanism 14 alternately moves the head unit 11 and the work W in synchrony with the activation of the functional liquid discharge head 21, in order to properly discharge the functional liquid onto the surface of the work W. That is, in the liquid droplet discharge apparatus 1, the movement of the work W in the main scanning direction (X-axis direction by the X-axis table 15 and the movement of the head unit 11 in the sub-scanning direction (Y-axis direction) by the Y-axis table 16, are repeated, and the functional liquid is discharged during movement of the work W in the main scanning direction, so that a film body made from the functional material is formed on the whole surface of the work W.

Further, although in this embodiment, the work W is moved in the main scanning direction and the head unit 11 is moved in the sub-scanning direction, it is sufficient if only the head unit 11 is scanned (moved) relative to the work W, and the head unit 11 may be moved in the main scanning direction. Furthermore, a construction may be employed in which the work W is fixed and the head unit 11 is moved in both the main scanning direction and the sub-scanning direction.

Figure 3:
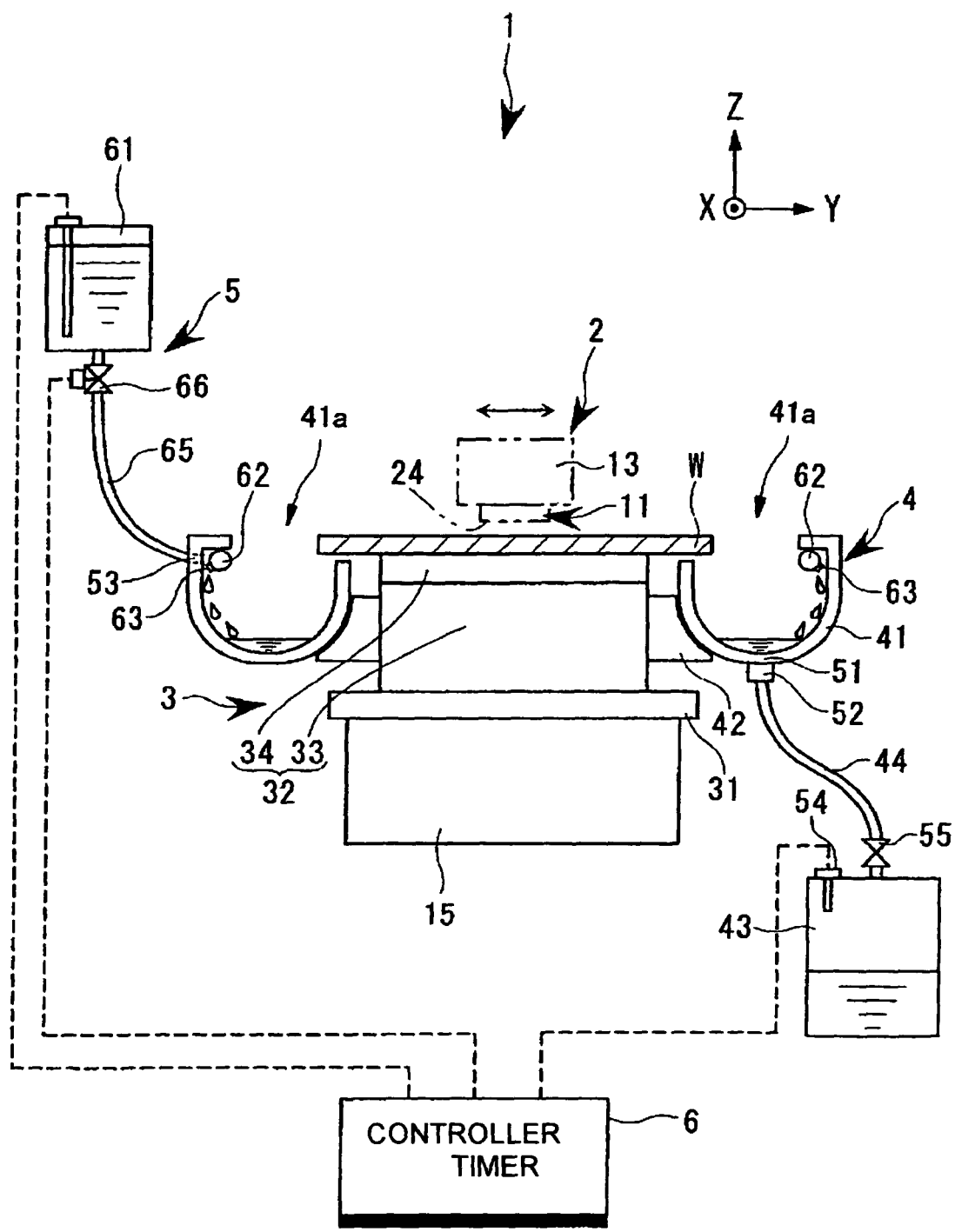
FIG. 3 is a longitudinal sectional view of surroundings of waste functional liquid storage means constituting the liquid droplet discharge apparatus.

Next, the mounting device 3 will be described. As shown in FIG. 3, the mounting device 3 has a base plate 31 fixed to the X-axis table 15, a θ table 33 for correcting the orientation of the work W in the θ angular direction, and an absorption table 34 for mounting the work W integrally supported on the base plate 31. That is, the θ table 33 and the absorption table 34 constitute the work table 32.

The base plate 31 supports the θ table 33 rotatively in the θ angular direction and supports the absorption table 34 via the θ table 33. The θ table 33 can rotate the work W set via the absorption table 34 in the θ angular direction on the basis of the image recognized by the work recognition camera. Accordingly, the θ axis is corrected such that the work W is mounted to a proper position relative to the head unit 11. Further, a plurality of suction holes 35 is formed in the absorption table 34 (see FIG. 4), and the work W is sucked through the suction holes 35 to be absorbed and fixed to the absorption table 34. Further, since the horizontal surfaces of the θ table 33 and the absorption table 34 have a size smaller than the work W, the work table 32 is not contaminated with the functional liquid splashed from the work W.

Next, the waste functional liquid storage device 4 will be described with reference to FIGS. 3 and 4. The waste functional liquid storage device 4 can include a functional liquid receiver 41 for receiving the functional liquid splashed from the work W, a plurality of support brackets 42 for supporting the functional liquid receiver 41, a waste functional liquid tank 43 for storing the functional liquid discharged from the functional liquid receiver 41, and a drain tube 44 for connecting the functional liquid receiver 41 to the waste functional liquid tank 43.

The functional liquid receiver 41 has a substantially U-shaped gutter, and the upper end of its outer circumferential surface is bent inwardly. Further, in order to efficiently receive the functional liquid splashed from the work W, the functional liquid receiver 41 is formed in a ring shape corresponding to the flat shape of the work W. That is, the functional liquid drained from the functional liquid discharge head 21 is received by the functional liquid receiver 41 through a liquid droplet reception area 41a of which one end (a part) is formed by the work W and the other end is formed by the functional liquid receiver 41. Further, the functional liquid receiver 41 has a drain hole 51 for draining the functional liquid in its bottom, and a drain hole metal fitting 52 for connecting the drain hole 51 to the drain tube 44 is attached to the drain hole 51. Further, the top portion of the outer circumferential surface of the functional liquid receiver 41 is provided with an end connection 53 for connecting a cleaning liquid release pipe 62 to a cleaning liquid supply tube 65 to be described.

As shown in FIG. 3, the support bracket 42 is fixed to a lateral face of the θ table 33 of the mounting device 3 to support the functional liquid receiver 41 such that the ring-shaped functional liquid receiver 41 always faces the circumferential edge portion of the set work W, that is, the circumferential edge portion of the work W and a part of the functional liquid receiver 41 overlap each other. Further, a plurality of support brackets 42 can be arranged equidistantly around the θ table 33. Further, the support brackets 42 support the functional liquid receiver 41 downwardly and obliquely toward the drain hole 51 so as to rapidly drain the functional liquid received by the functional liquid receiver 41.

The waste functional liquid tank 43 is connected via pipes to the functional liquid receiver 41 via a discharge tube (silicon tube) 44, and stores the functional liquid splashed from the work W and received by the functional liquid receiver 41. Further, the waste functional liquid tank 43 can be properly exchanged when it becomes fully filled with the functional liquid. Moreover, the waste functional liquid tank 43 is provided with a functional liquid fullness detector 54 for detecting the state in which the waste functional liquid tank 43 is fully filled, and the controller 6 controls the driving of the functional liquid discharge head 21 such that the functional liquid does not overflow from the waste functional liquid tank 43. Furthermore, the waste functional liquid tank 43 may be made from stainless steel, resin, glass or the like.

The drain tube 44 has its one end thereof connected to the drain hole metal fitting 52 of the functional liquid receiver 41 and the other end connected to the waste functional liquid tank 43, and connects the functional liquid receiver 41 to the waste functional liquid tank 43 via pipes. The drain tube 44 is provided with a functional liquid blocking valve 55 for blocking the flow of the functional liquid from the functional liquid receiver 41 to the waste functional liquid tank 43.

Figure 4:
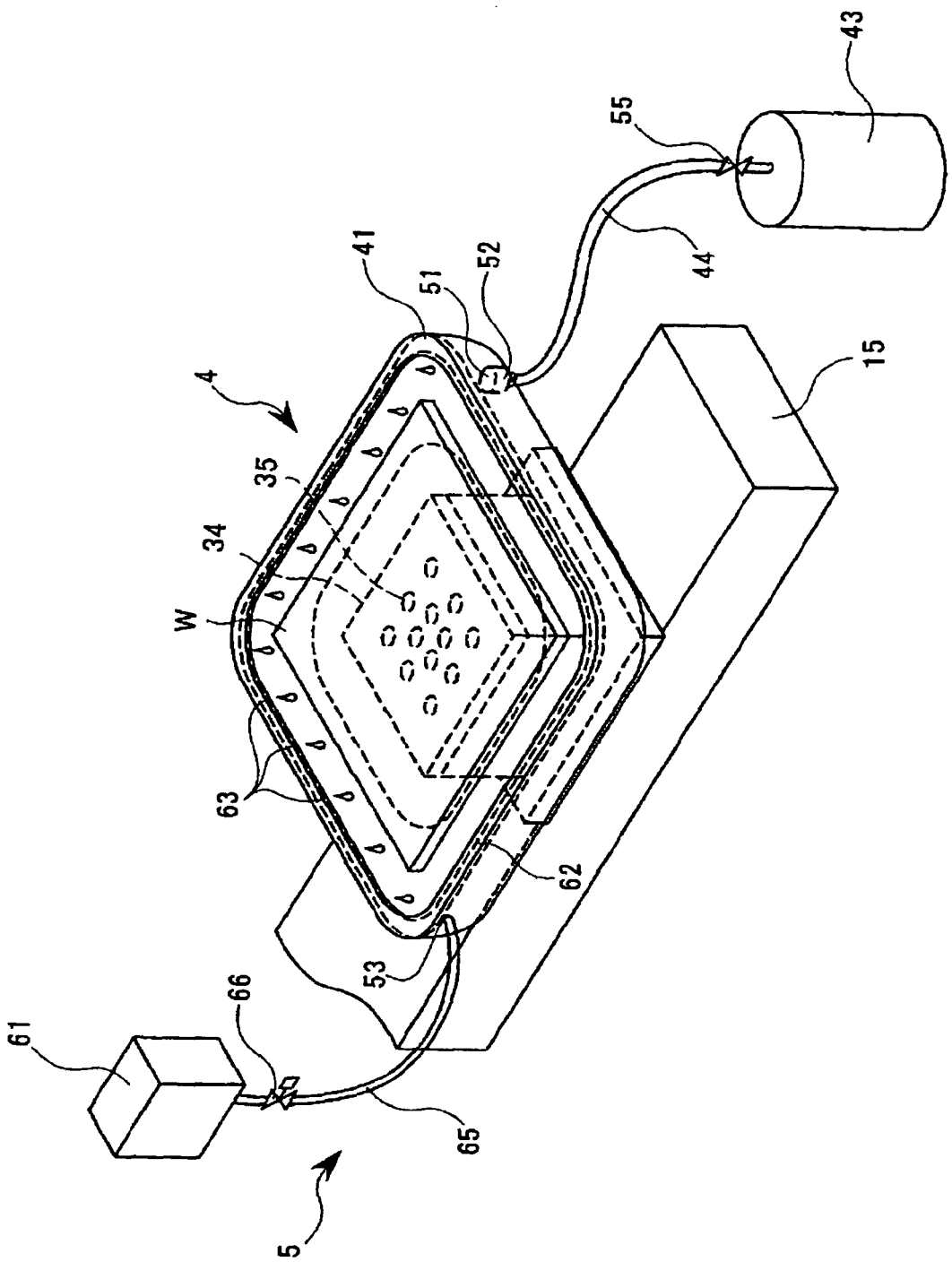
FIG. 4 is a perspective view illustrating an outward appearance of the waste functional liquid storage means.

The cleaning device 5 for cleaning the functional liquid receiver 41, as shown in FIGS. 3 and 4, can include a cleaning liquid tank 61 for storing cleaning liquid for dissolving the functional liquid, a cleaning liquid release pipe 62 for releasing the cleaning liquid into the functional liquid receiver 41, and a cleaning liquid supply tube 65 for connecting, via pipes, the cleaning liquid tank 61 to the cleaning liquid release pipe 62. Further, the cleaning liquid tank 61 is provided with a cleaning liquid decrease detector 66 for detecting a decreased state of the cleaning liquid. Thus, the decreased state of the cleaning liquid tank 61 can be detected.

The cleaning liquid release pipe 62 can be connected to the end connection 53 provided at an upper end of the outer circumferential surface of the functional liquid receiver 41 and is disposed in a ring shape along the inside of the bent portion of the functional liquid receiver 41. Also, the cleaning liquid release pipe 62 is connected to the cleaning liquid supply tube (or silicon tube) 65 via the end connection 53, and is connected to the cleaning liquid tank 61 via the cleaning liquid supply tube 65. A plurality of cleaning liquid release holes 63 is formed substantially equidistantly in the cleaning liquid release pipe 62, and thus the cleaning liquid is released uniformly into the functional liquid receiver 41. Further, the respective cleaning liquid release holes 63 are formed toward the outer circumferential surface of the functional liquid receiver 41, and thus the cleaning liquid can be efficiently released to the outer circumferential surface.

Also, in order to clean the functional liquid receiver 41 at predetermined time intervals, the upper end portion of the cleaning liquid supply tube 65 is provided with an electronic valve 66 connected to the controller 6. A timer is controlled such that the electronic valve 66 is opened and closed at predetermined time intervals. However, the opening and closing of the electronic valve 66 may be carried out manually without relying upon the timer control.

The respective device of the liquid droplet discharge apparatus 1 described above can be controlled by the controller 6, and the controller 6 generally controls the liquid droplet discharge apparatus 1 as a whole to carry out discharge of the functional liquid onto the work W under a predetermined condition.

Figure 5:
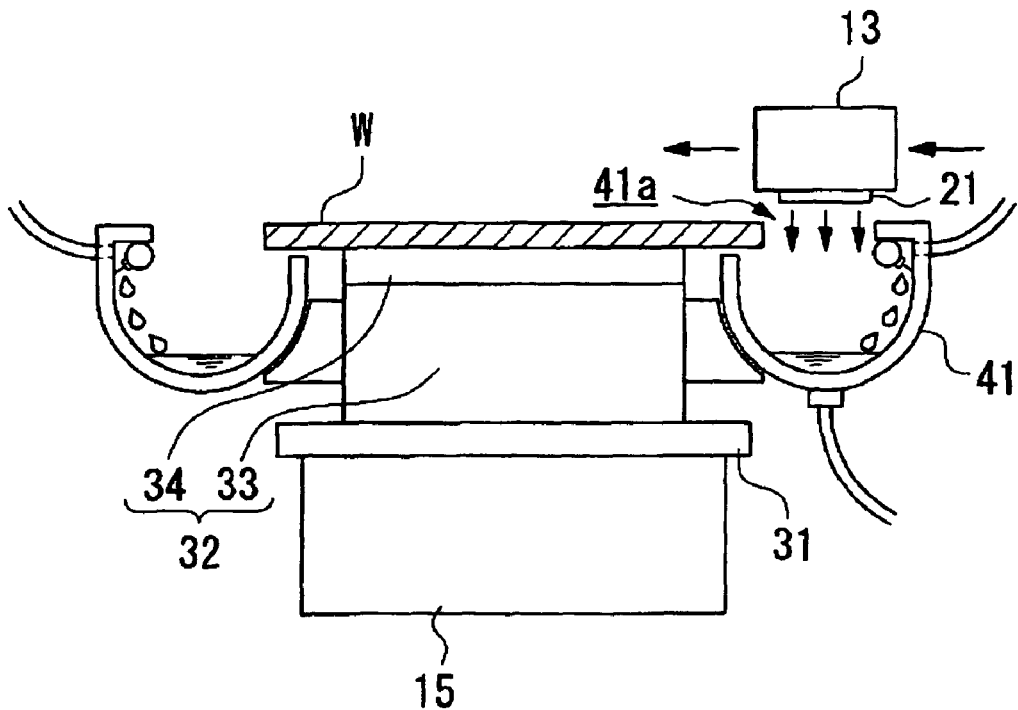
FIG. 5 is a view illustrating a positional relationship between a head and a liquid droplet reception area during acceleration.
Figure 6:
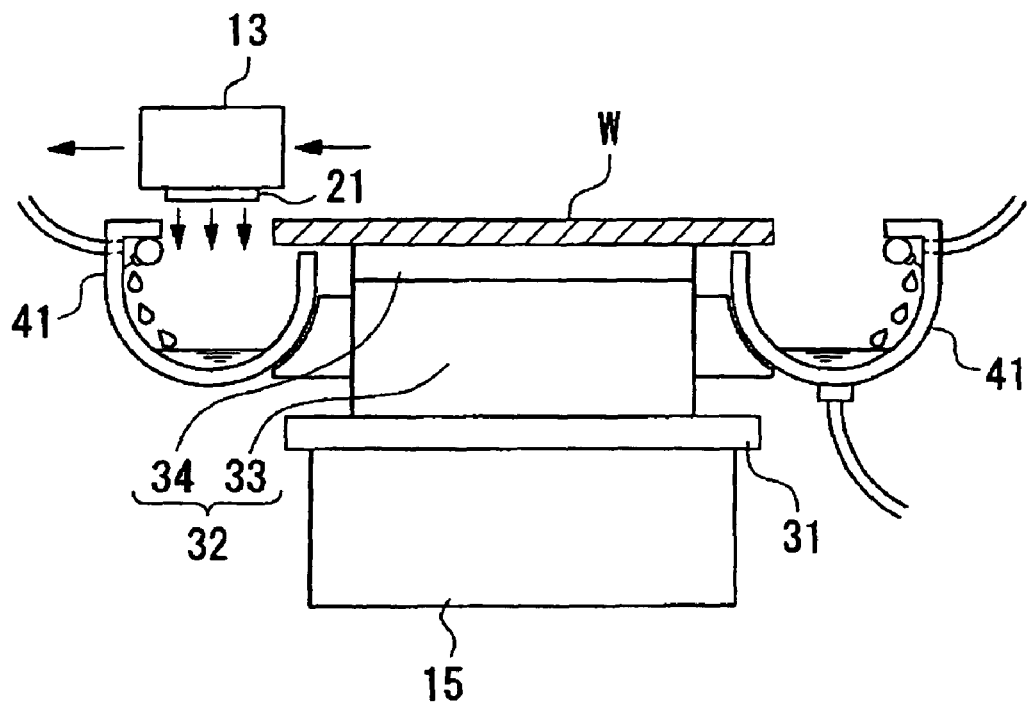
FIG. 6 is a view illustrating a positional relationship between the head and the liquid droplet reception area during deceleration.

The operation of the liquid droplet discharge apparatus 1 having the above construction will be described with reference to FIGS. 5 and 6.

On the other hand, although the work W is moved relative to the functional liquid discharge head 21 when discharging droplets of the functional liquid onto the surface of the work W, it is shown, herein, for the purpose of convenience, that the functional liquid discharge head 21 is moved relative to the work W.

First, the X and Y movement mechanism 14 drives the X-axis table 15 and the Y-axis table 16 to position the work W and the functional liquid discharge head 21 at the scanning start position. Then, by starting the liquid droplet discharge step to drive the X-axis table 15, the work W is accelerated up to a relative speed (scanning speed) between the work W and the functional liquid discharge head 21 when the droplets of the functional liquid are discharged onto the work W from the functional liquid discharge head 21. In the course of acceleration of the work W, at the time point when the liquid droplet reception area 41a reaches just below the functional liquid discharge head 21 as shown in FIG. 5, the controller 6 outputs a driving signal having a flushing waveform to the functional liquid discharge head 21. By doing so, the droplets of functional liquid are preliminarily discharged from the functional liquid discharge head 21, and thus flushing is carried out to the functional liquid receiver 41 via the liquid droplet reception area 41a (preliminary discharge step).

Further, the timing of the controller 6 as it outputs the driving signal with a flushing waveform needs to match with the timing of the discharged liquid droplets as they pass through the liquid droplet reception area 41a. For this reason, when a time lag occurs between the output of the driving signal and the passage of the discharged liquid droplets, the driving signal may be outputted before the liquid droplet reception area 41a reaches just below the functional liquid discharge head 21, in consideration of this time lag. Moreover, in FIG. 5, the liquid droplet reception area 41a is shown to have an opening large enough to the liquid droplets that are flushed from all the overall discharge nozzles of the functional liquid discharge head 21. However, when the opening of the liquid droplet reception area 41a are narrow, for example, flushing may be carried out by every row of a plurality of head rows and by every discharge nozzle row.

That is, by means of the control of the controller 6, flushing may be selectively carried out in accordance with the size of the opening of the liquid droplet reception area 41a and the array pitch of the discharge nozzle rows and the head rows. Specifically, when the flushing is carried out by every head row, the driving signal having the flushing waveform may be sequentially outputted to the head row just below that which the liquid droplet reception area 41a has reached, and when the flushing is carried out by every discharge nozzle row, the driving signal having the flushing waveform may be sequentially outputted to the discharge nozzle row just below that which the liquid droplet reception area 41a has reached.

When the flushing during acceleration is completed and the scanning speed is stabilized at a constant speed, droplet discharge of the functional liquid is carried out to a predetermined place on the surface of the work W (see FIG. 3). Then, when the droplet discharge onto the surface of the work W by scanning is completed and the work W reaches a position departing from below the functional liquid discharge head 21, for example, as shown in FIG. 6, the work W is decelerated via the X-axis table 15 for the purpose of ending the liquid droplet discharge step or beginning the next scanning. During deceleration of the work W, the controller 6 outputs the driving signal having a fine vibration waveform to the functional liquid discharge head 21. When this driving signal is outputted, the functional liquid within the functional liquid discharge head 21 is vibrated to an extent that the functional liquid is not discharged from the head 21 (vibrating process), and specifically the surfaces of meniscuses in the discharge nozzles are finely vibrated. By doing so, it is possible to suppress the increase in the viscosity of functional liquid or a segregation of solid contents in the discharge nozzles.

Further, this fine vibration may be carried out in the course of movement at a constant speed after liquid droplet discharge onto the work W is completed, not limited to during the deceleration. Similarly, flushing during the acceleration may be carried out in the course of movement at a constant speed just immediately preceding the start of liquid droplet discharge onto the work W.

Then, when the functional liquid is stored and the waste functional liquid tank 43 is fully filled by means of preliminary discharge of the functional liquid or the liquid droplet discharge to the edge portion of the work W, the functional liquid fullness detector 54 detects the fullness of the waste functional liquid tank 43 to output a fullness signal to the controller 6. Then, the controller 6 turns on an indicator (not shown), indicating that the waste functional liquid tank 43 is full, and notifies the fullness of the waste functional liquid tank 43. Then, after a thin film has been formed on the work W during formation of the thin film, the controller 6 stops the functional liquid discharge device 2 such that the functional liquid does not overflow from the waste functional liquid tank 43. Then, when the full waste functional liquid tank 43 is exchanged and the fullness signal is not detected, the controller 6 turns out the indicator indicating that the waste functional liquid tank 43 is full, and activates the functional liquid discharge device 2 again. Further, although the display of the indicator is used as means of notifying the fullness of the waste functional liquid tank 43, it should be understood that the present invention is not limited thereto, and the fullness of the waste functional liquid tank 43 may be notified via, for example, voice.

Further, on the basis of a signal from the cleaning liquid decrease detector 66, which detects a decrease, by a predetermined amount, of the cleaning liquid of the cleaning liquid tank 61, the controller 6 turns on the cleaning liquid decrease indicator (not shown).

As described above, in this embodiment, since the flushing is carried out during the relative movement in the liquid droplet discharge step of the surface of the work W without stopping the X-axis table 15, the process for carrying out flushing need not be prepared separately and thus it is possible to reduce the time required for the flushing, so that it is possible to improve the throughput. Further, in this embodiment, since the functional liquid receiver 41 for discharging liquid droplets to the edge portion of the work W is used for the flushing, a separate flushing area or absorption member need not be provided, and thus it is possible to provide an apparatus that is small and operates at low cost.

Furthermore, in this embodiment, since the part of the liquid droplet reception area 41a for carrying out the flushing is formed from the work W itself, the discharge interval between the preliminary discharge and the liquid droplet discharge onto the work W can be minimized. For this reason, it is possible to prevent an increase in the viscosity of the functional liquid or a segregation of solid contents after the preliminary discharge, and thus to realize a more stable discharge of liquid droplets onto the work W. In particular, in this embodiment, since the functional liquid within the head 21 is vibrated after the liquid droplet discharge onto the work W, even when the flushing is not carried out, it is possible to suppress an increase in the viscosity of the functional liquid or a segregation of the solid contents. Moreover, in this embodiment, since the functional liquid is not discharged from the head 21 even when vibrating the functional liquid, it is possible to prevent the functional liquid from being wasted.

Furthermore, the liquid droplet discharge apparatus 1 according to the present invention can coat various optical lenses in addition to the spectacle lens, and can be applied to methods of manufacturing various flat displays. Here, the manufacturing method using the liquid droplet discharge apparatus 1 will be described, using as an example a method of manufacturing a liquid crystal display device and a method of manufacturing an organic EL device.

Figure 7:
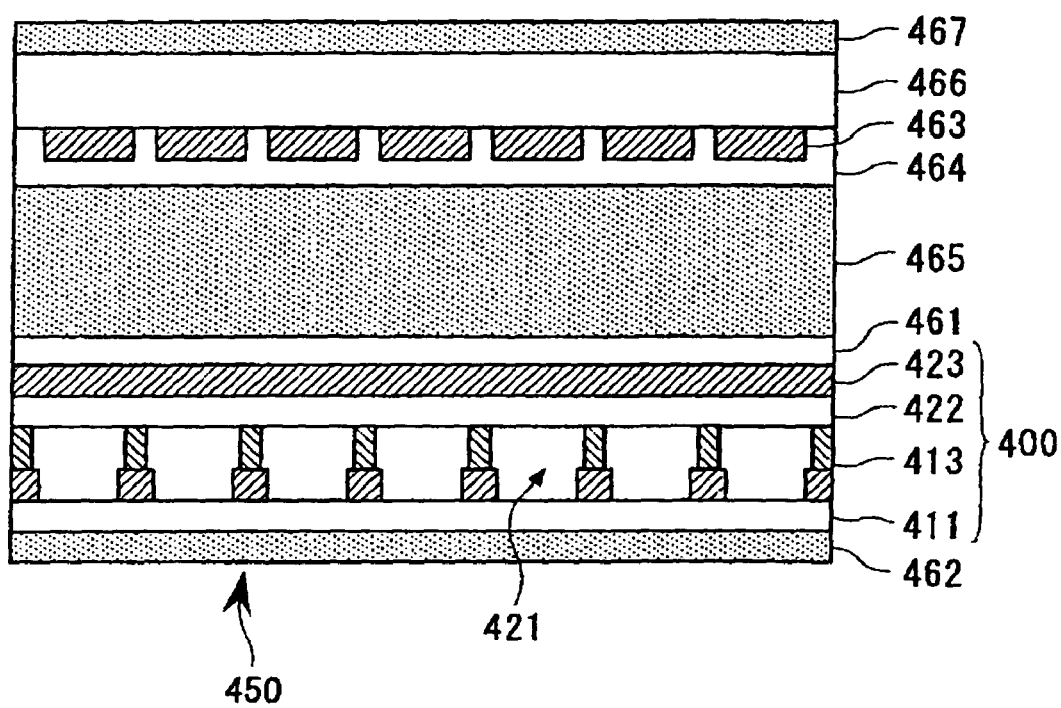
FIG. 7 is a cross-sectional view of a liquid crystal display device manufactured according to an embodiment of the present invention.

FIG. 7 is a cross-sectional view of a liquid crystal display device. As shown in FIG. 7, the liquid crystal (color) display device 450 is constructed by combining a color filter 400 and a counter substrate 466 between upper and lower polarizing plates 462, 467 and then encapsulating a liquid crystal composition 465 between both plates. Further, alignment films 461, 464 are formed between the color filter 400 and the counter substrate 466, and TFT (Thin Film Transistor) elements (not shown) and pixel electrodes 463 are formed in a matrix on the inner surface of one counter substrate 466.

The color filter 400 can include pixels (filter elements) arranged in a matrix, and the pixels are partitioned individually by partitions (banks) 413. Any one of liquid materials (filter materials) of red (R), green (G) or blue (B) is introduced into the respective pixels. That is, the color filter 400 can include a transmissive substrate 411 and transmissive partitions 413. The portions in which the partitions 413 are not formed (removed) constitute the pixels. The liquid material of each color introduced (discharged) into the pixels constitutes coloring layers 421. An overcoat layer 422 as a coating member and an electrode layer 423 are formed on the top surface of the partitions 413 and the coloring layers 421.

Also, in this embodiment, the respective liquid materials, R, G and B are introduced into the pixels partitioned by the partitions 413, using the liquid droplet discharge method. That is, the liquid droplets of each color of R, G and B are selectively discharged onto each region for forming the coloring layers, using the functional liquid discharge head 21. Next, by drying the applied liquid materials, the coloring layers 421 are obtained. Similarly, the overcoat layer (overcoat film) 422 as a film body is formed using the liquid droplet discharge method.

In this embodiment, in forming the coloring layers 421, the pitch of the respective discharge nozzles 23 and the pitch of the pixels are matched by variably adjusting the oblique angle of the functional liquid discharge head 21, and in forming the overcoat layer 422, the film thickness thereof is adjusted by properly varying the oblique angle of the functional liquid discharge head 21.

Figure 8:
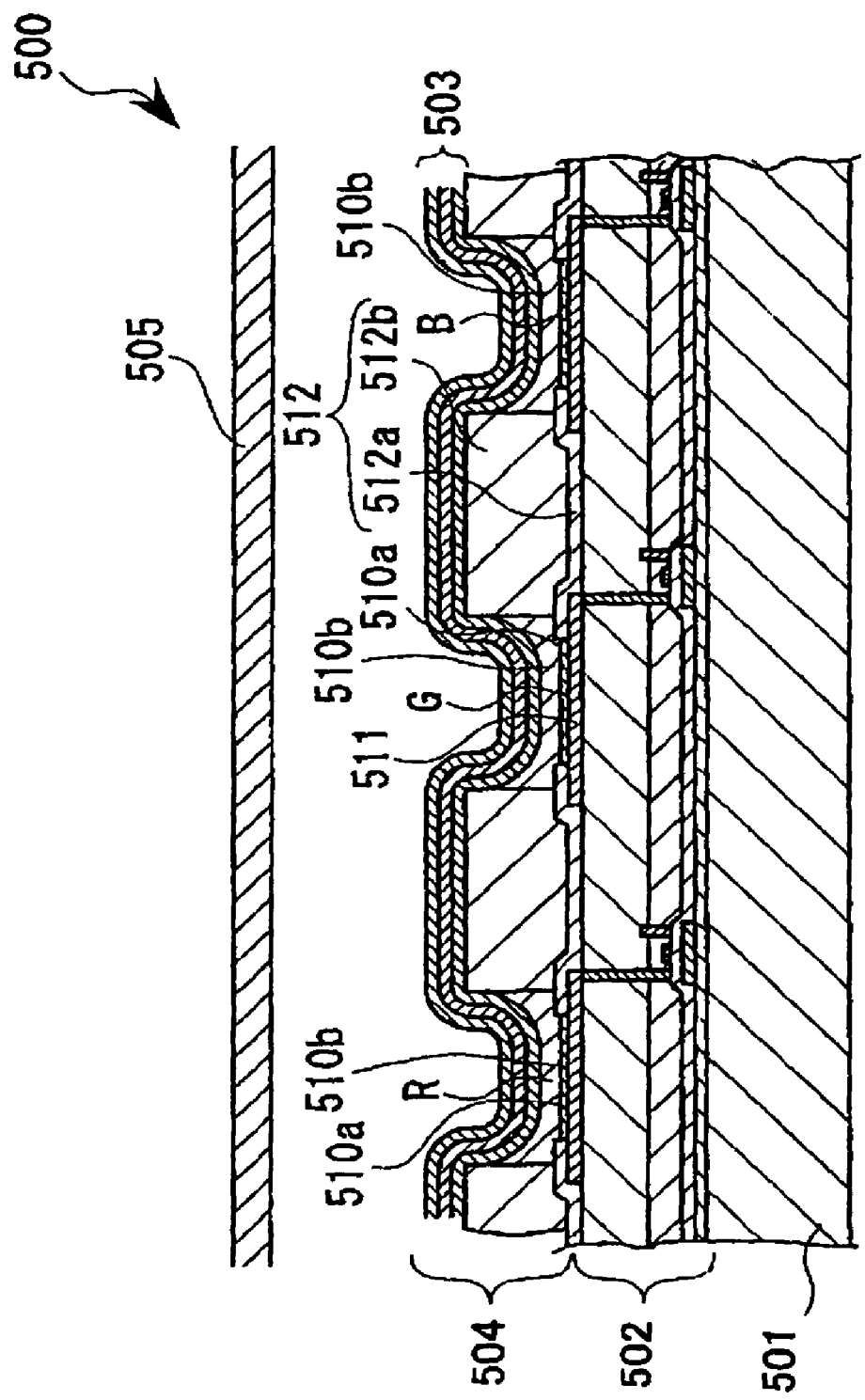
FIG. 8 is a cross-sectional view of an organic EL device manufactured according to an embodiment of the present invention.

Similarly, an organic EL device and a method of manufacturing the same will be described with reference to FIG. 8. As shown in FIG. 8, in the organic EL device 500, a circuit element portion 502 is laminated on a glass substrate (substrate) 501, and organic EL elements 504 constituting the main body are laminated on the circuit element portion 502. Further, a sealing substrate 505 is provided above the organic EL elements 504 with a space filled with inert gas therebetween.

In the organic EL elements 504, banks 512 are formed by inorganic bank layers 512a and organic bank layers 512b overlapping the inorganic bank layers 512a, and pixels are formed in a matrix by the banks 512. Further, in each pixel, a pixel electrode 511, a light-emitting layer 510b of R, G and B and a hole injection/transport layer 510a are sequentially laminated from the bottom, and the whole surface is covered with a counter electrode 503 in which a plurality of thin films made from Ca, Al or the like are laminated.

Also, in this embodiment, the light-emitting layers 510b of R, G, and B and the hole injection/transport layers 510a are formed, using the aforementioned liquid droplet discharge method. Further, after forming the hole injection/transport layers 510a, a counter electrode (counter electrode film) 503 as a film body is similarly formed out of liquid metal material such as Ca or Al, using the liquid droplet discharge method. Furthermore, when the portion is sealed with a highly hermetic resin instead of the sealing substrate 505, it is preferable that the sealing be carried out using the liquid droplet discharge method.

In this embodiment, in forming the light-emitting layers 510b and the hole injection/transport layers 510a, the pitch of the respective discharge nozzles 23 and the pitch of the pixels may be matched by properly varying the oblique angle of the functional liquid discharge head 21, and in forming the counter electrode 503, the film thickness thereof may be adjusted by properly varying the oblique angle of the functional liquid discharge head 21.

As described above, according to the present invention, it is possible to prevent a decrease of throughput and provide an apparatus that is small and inexpensive to operate. Further, according to the present invention, since stable liquid droplet discharge can be performed, it is possible to obtain a high-quality device.

While the invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A method of manufacturing a device, in which a work is set so that part of a functional liquid receiver overlaps a peripheral portion of the work in plan view, the method comprising:
    a preliminary discharge step which preliminarily discharges liquid droplets of the functional liquid from nozzles to the functional liquid receiver, wherein the preliminary discharge is carried out in a functional liquid receiving area defined by at least an edge of the work; and
    a liquid droplet discharge step which discharges the liquid droplets of the functional liquid onto a surface of the work from the nozzles while moving heads having the nozzles relative the work at a constant speed,
    wherein when the relative movement of the heads and the work is performed, the preliminary discharge step is carried out (i) while the heads or the work is accelerating until reaching the constant speed and (ii) while the heads and the work are relatively moving at the constant speed immediately before the liquid droplet discharge step begins.

2. The method of manufacturing a device according to claim 1, the work being a lens, and a film body being a transmissive coating film for coating the lens.

3. The method of manufacturing a device according to claim 1, the work being a substrate on which filter elements are arranged, and a film body being an overcoat film for coating the filter elements.

4. The method of manufacturing a device according to claim 1, the work being a substrate on which pixels including EL light-emitting layers are arranged, and a film body being a counter electrode film formed at a predetermined place on the EL light-emitting layers.

5. The method of manufacturing a device according to claim 1, wherein the functional liquid receiving area is further defined by an edge of the functional liquid receiver.

* * * * *